US007954034B1

(12) United States Patent
Curry et al.

(10) Patent No.: US 7,954,034 B1
(45) Date of Patent: May 31, 2011

(54) METHOD OF AND SYSTEM FOR PROTECTING DATA DURING CONVERSION FROM AN ECC PROTECTION SCHEME TO A PARITY PROTECTION SCHEME

(75) Inventors: Clayton A. Curry, Framingham, MA (US); Brian K. Campbell, Cedar Park, TX (US)

(73) Assignee: EMC Corporation, Hopkinton, MA (US)

( * ) Notice: Subject to any disclaimer, the term of this patent is extended or adjusted under 35 U.S.C. 154(b) by 1220 days.

(21) Appl. No.: 11/241,167

(22) Filed: Sep. 30, 2005

(51) Int. Cl.
*H03M 13/00* (2006.01)
(52) U.S. Cl. ...................................... 714/758
(58) Field of Classification Search ................ 714/758
See application file for complete search history.

(56) References Cited

U.S. PATENT DOCUMENTS

| | | | | |
|---|---|---|---|---|
| 4,796,260 A * | 1/1989 | Schilling et al. | ............... | 714/755 |
| 4,817,095 A * | 3/1989 | Smelser et al. | ................ | 714/764 |
| 4,884,271 A * | 11/1989 | Concha et al. | ................ | 714/764 |
| 5,173,905 A * | 12/1992 | Parkinson et al. | ............ | 714/768 |
| 5,517,508 A * | 5/1996 | Scott | ............................. | 714/776 |
| 5,748,885 A * | 5/1998 | Gallagher | ....................... | 714/48 |
| 6,615,387 B1 * | 9/2003 | Williamson et al. | ........... | 714/785 |
| 2003/0066010 A1 * | 4/2003 | Acton | ............................ | 714/758 |
| 2004/0010742 A1 * | 1/2004 | Williamson et al. | ........... | 714/746 |
| 2004/0210814 A1 * | 10/2004 | Cargnoni et al. | ............. | 714/758 |

* cited by examiner

*Primary Examiner* — Scott T Baderman
*Assistant Examiner* — Enam Ahmed
(74) *Attorney, Agent, or Firm* — Krishnendu Gupta; Scott A. Ouellette

(57) ABSTRACT

A method of protecting data during transmission from an ECC protection scheme to a parity protection scheme, including reading a data word and an associated ECC from an upstream device; generating parity for the data word; generating a new ECC from the data word; computing a syndrome of the associated ECC and the new ECC; determining, based on the syndrome, if an error is present in the data word or the associated ECC; correcting a correctable error in the data word; correcting the parity for the data word; and transmitting the corrected data word and the corrected parity for the data word to a downstream device.

13 Claims, 2 Drawing Sheets

METHOD OF AND SYSTEM FOR PROTECTING DATA DURING CONVERSION FROM AN ECC PROTECTION SCHEME TO A PARITY PROTECTION SCHEME

FIELD OF THE INVENTION

This invention relates generally to a method of and system for protecting data during conversion from an ECC protection scheme to a parity protection scheme and, more particularly, to a method of and system for generating parity for ECC protected data read from memory before the ECC protection is removed.

BACKGROUND OF THE INVENTION

During the high-speed transmission of digital data through a computer system such as a data storage device or communication system, it is extremely important to monitor the digital data for errors and to be able to correct any errors that may occur. Typical schemes for checking for errors and, in some cases, correcting errors, include the use of parity bits and error correcting codes (ECC). Several methods incorporate both schemes in order to provide redundant error checking in the data transmission system.

SUMMARY OF THE INVENTION

The present invention provides a system and method for protecting data that is transmitted from an upstream device utilizing ECC for data protection to a downstream device utilizing parity for data protection in which the data is never unprotected by either ECC, parity or both.

BRIEF DESCRIPTION OF THE DRAWINGS

These and other features of the invention will become more readily apparent from the following detailed description when read together with the accompanying drawings, in which.

DETAILED DESCRIPTION

Figure 1:
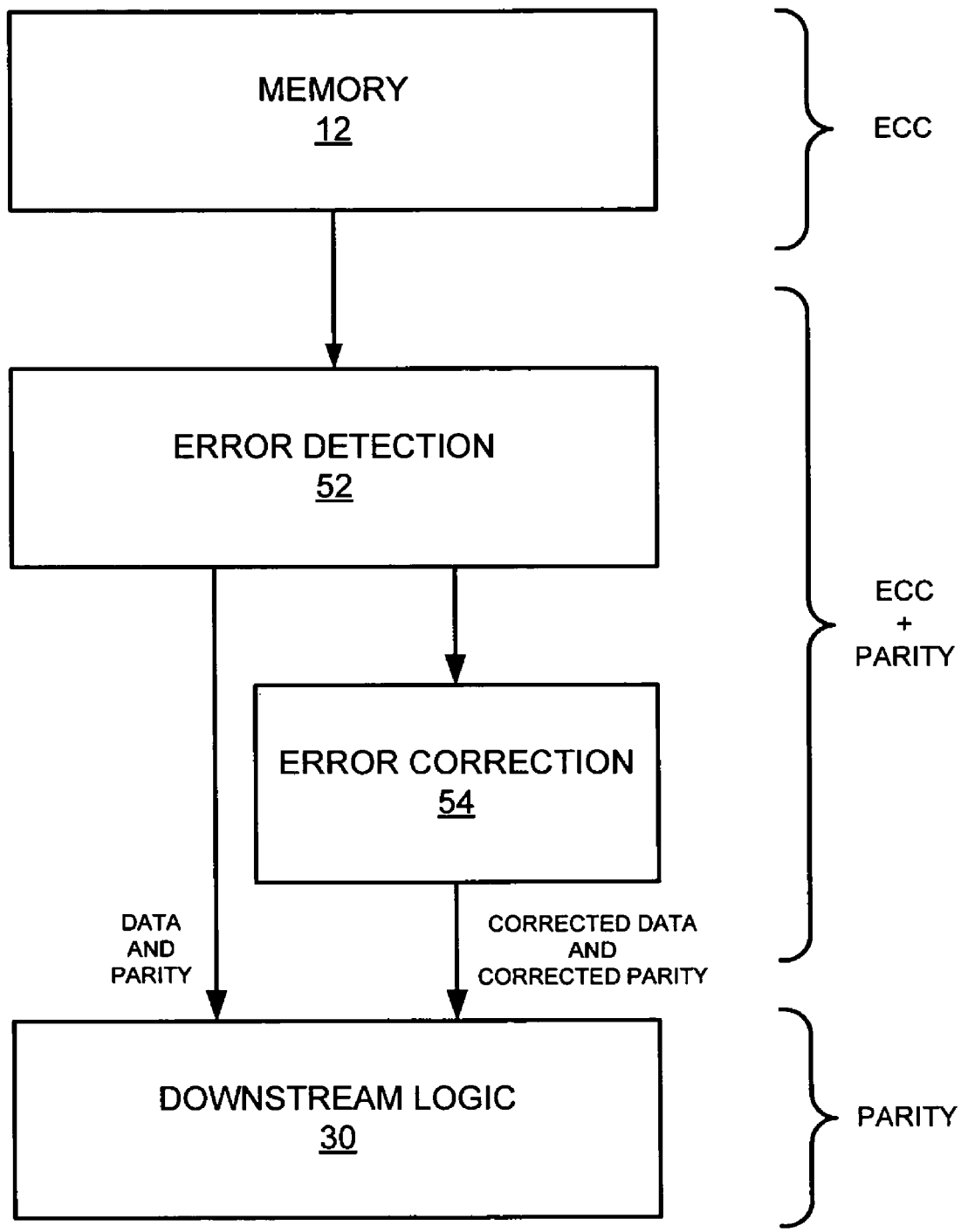
FIG. 1 is a schematic block diagram of a system for protecting data during conversion from an ECC protection scheme to a parity protection scheme in accordance with the invention.

One embodiment of the system for protecting data during conversion from an ECC protection scheme to a parity protection scheme is shown in FIG. 1. Data and associated ECC words are read from memory 12 into error detection device 52. As described below, if errors are not found in the data or ECC or if uncorrectable errors are found, the data and generated parity are transmitted to downstream logic 30 for further processing. If correctable errors are detected in error detection device 52, the errors are corrected in error correction device 54 before being transmitted to downstream logic 30 for further processing.

Figure 2:
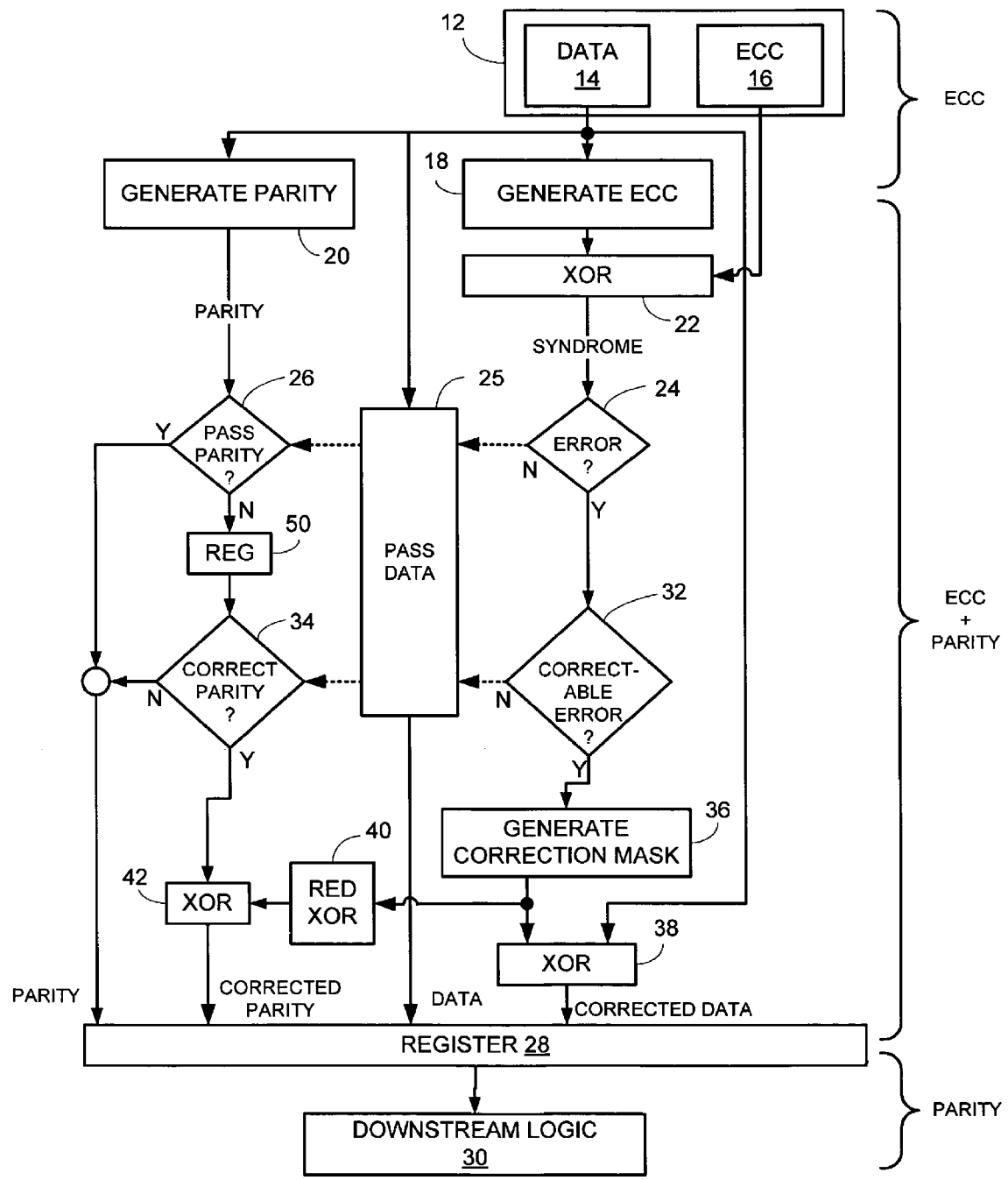
FIG. 2 is a functional block diagram of a system for protecting data during conversion from an ECC protection scheme to a parity protection scheme in accordance with the invention.

FIG. 2 is a functional block diagram of one embodiment the data protection system of the present invention. In a system in which data in global memory is stored with an ECC protection word, but where other sections of the system with which the global memory is associated utilize parity protection of the data, it is crucial that, when data is read out from memory having ECC protection associated therewith, the data is never unprotected as it is converted from ECC protection to parity protection.

As shown in FIG. 2, memory 12 includes data 14 and ECC 16. When the data is written into the memory 12, an ECC is generated for, and associated with, each data word. For the purpose of this example, the data words include 128 bits and the ECC includes 16 bits. When the data 14 is read from the memory 12, a new 16-bit ECC is generated for each data word, Step 18. This generated ECC is compared to the original ECC 16 stored with the data word 14 in memory 12. This comparison is preferably in the form of an XOR operation, Step 22. As is known in the art, the result of the XOR operation is the syndrome. The 16-bit syndrome is then analyzed to determine whether an error is present in the data word or in the ECC, Step 24. As is known, if the syndrome is 0x0, all of the bits of the generated ECC are the same as the corresponding bits of the original ECC 16, thus indicating that no errors are present in either the data word or the original ECC. Had there been an error in the data word, the generated ECC would have been different from the original ECC and, if there was an error in the original ECC, the generated ECC would have been different from the original ECC.

Furthermore, in Step 20, as soon as the data word 14 is read from the memory 12, parity bits are generated for the data word. In one embodiment of the invention, the type of parity generated is odd parity. Accordingly, at this point in the processing of the data word, it is protected both with the original ECC code with which it was stored in memory 12 and with parity.

If, in Step 24, it is determined that there is no error in the data word or in the original ECC, i.e., the syndrome is 0x0, the data word is passed through, Step 25, to register 28 where the ECC is dropped. Furthermore, if there is no error indicated by the syndrome, Step 24, the parity generated in Step 20 is also passed, Step 26, to the register 28. The data word and parity are then transmitted to downstream logic 30 for further processing.

If, in Step 24, it is determined that there is an error in either the data word or the original ECC, based on the syndrome not being 0x0, the system then determines whether the error is correctable, Step 32. Those of skill in the art will know numerous methods for determining whether an error indicated by the syndrome is correctable or not and whether a correctable error is located in the data word or in the ECC. At this point, since there is a possibility that the parity also includes an error, because the error could be in the data word from which the parity was generated, the parity, in Step 26 is not passed through to the register 28, but is passed to a register 50, until the system determines whether the error is correctable in Step 32.

If, based on the analysis of the syndrome in Step 32, the error is deemed to be uncorrectable, the data word is not corrected and is passed through uncorrected, Step 25, to the register 28. Likewise, the parity stored in register 50 is not corrected, Step 34, and is passed to register 28. The downstream logic 30 will address the uncorrectable error in the data word and parity, if that is where the error is determined to be.

If, in Step 32, the error is determined to be correctable, a 128-bit correction mask is generated, Step 36. The generation of an appropriate correction mask is known and will therefore not be described here. The data word is compared to the correction mask, preferably by means of an XOR operation, Step 38, to correct the error in the data word. The corrected data is then transmitted to the register 28. If the error was in the ECC and not in the data word, the comparison of the data word to the correction mask will not change the data word. Since the ECC is dropped from the data word, no attempt is made to correct the ECC.

The 128-bit correction mask is also reduced to a 16-bit operator, preferably through a reduction-XOR process, Step 40, and compared to the 16-bit parity, preferably through an XOR operation, Step 42. The XOR operation in Step 42 will correct any error in the parity that resulted from an error in the data word from which the parity was generated in Step 20. The corrected parity is then transmitted to register 28, and both the corrected data word and the corrected parity are transmitted to the downstream logic 30 for further processing. Again, if the error was in the ECC and not in the data word, no error would be present in the parity and the comparison of the parity to the 16-bit operator will not change the parity.

Accordingly, the invention includes a system and method for protecting data that is transmitted from an upstream device utilizing ECC for data protection to a downstream device utilizing parity for data protection in which the data is never unprotected by either ECC, parity or both. As shown in FIGS. 1 and 2, the data is protected by ECC in the memory 12, by both the ECC and parity in error detection device 52 and error correction device 54 and by parity in downstream logic 30. In the system of FIG. 1, Steps 18 through 26 of FIG. 2 are performed in error detection device 52 and Steps 32 through 42 are performed in error correction device 54.

The system and method described herein may find applicability in any computing or processing environment. The system and method may be implemented in hardware, software, or a combination of the two. For example, the system and method may be implemented using circuitry, such as one or more of programmable logic (e.g., an ASIC), logic gates, a processor, and a memory.

The system and method may be implemented in computer programs executing on programmable computers that each includes a processor and a storage medium readable by the processor (including volatile and non-volatile memory and/or storage elements). Each such program may be implemented in a high-level procedural or object-oriented programming language to communicate with a computer system and method. However, the programs can be implemented in assembly or machine language. The language may be a compiled or an interpreted language.

Each computer program may be stored on an article of manufacture, such as a storage medium (e.g., CD-ROM, hard disk, or magnetic diskette) or device (e.g., computer peripheral), that is readable by a general or special purpose programmable computer for configuring and operating the computer when the storage medium or device is read by the computer to perform the functions of the data framer interface. The system and method also may be implemented as a machine-readable storage medium, configured with a computer program, where, upon execution, instructions in the computer program cause a machine to operate to perform the functions of the system and method described above.

Implementations of the system and method may be used in a variety of applications. Although the system and method is not limited in this respect, the system and method may be implemented with memory devices in microcontrollers, general-purpose microprocessors, digital signal processors (DSPs), reduced instruction-set computing (RISC), and complex instruction-set computing (CISC), among other electronic components.

Implementations of the system and method may also use integrated circuit blocks referred to as main memory, cache memory, or other types of memory that store electronic instructions to be executed by a microprocessor or store data that may be used in arithmetic operations.

The invention may be embodied in other specific forms without departing from the spirit or essential characteristics thereof. For example, while the invention has been described as utilizing 128 bit data words, 16 bit ECC, 16 bit syndromes and 16 bit parity, it will be understood that the invention may be utilized with data words, ECC, syndromes and parity of any number suitable number of bits. The scale of bits of the data processed by the invention is not pertinent to the invention. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

The invention claimed is:

1. A method of protecting data during transmission from an ECC protection scheme to a parity protection scheme, the method comprising:
   A. reading a data word and an associated ECC from an upstream device;
   B. generating parity for the data word;
   C. generating a new ECC from the data word;
   D. computing a syndrome of the associated ECC and the new ECC;
   E. determining, based on the syndrome, if an error is present in the data word or the associated ECC;
   F. generating a correction mask from the syndrome upon detecting a correctable error in the data word:
   G. correcting the correctable error in the data word, including comparing the data word to the correction mask to generate a corrected data word;
   H. correcting the parity for the data word, including comparing the parity to a form of the correction mask to generate a corrected parity; and
   I. transmitting the corrected data word and the corrected parity for the data word to a downstream device.

2. The method of claim 1 wherein Step D includes performing an XOR operation on the associated ECC and the new ECC.

3. The method of claim 1 wherein comparing the data word to the correction mask to generate the corrected data word comprises performing an XOR operation on the data word and the correction mask.

4. The method of claim 1 wherein the form of the correction mask is generated by performing a reduction XOR operation on the correction mask.

5. The method of claim 1 wherein, in Step E, if no error is detected, the data word and the parity are transmitted to the downstream device.

6. The method of claim 1 wherein, if an error is detected in Step E, the method further includes determining whether the error is correctable.

7. The method of claim 6 wherein, if the error is determined to be not correctable, the data word and the parity are transmitted to the downstream device.

8. A method of protecting data during transmission from an ECC protection scheme to a parity protection scheme, the method comprising:
   A. reading a data word and an associated ECC from an upstream device;
   B. generating parity for the data word;
   C. performing an error check operation on the associated ECC by generating a new ECC from the data word, computing a syndrome of the associated ECC and the new ECC and determining, based on the syndrome, if an error is present in the data word or the associated ECC;

D. generating a correction mask from the syndrome upon detecting a correctable error in the data word;

E. correcting the correctable error in the data word, including comparing the data word to the correction mask to generate a corrected data word;

F. correcting the parity for the data word, including comparing the parity to a form of the correction mask to generate a corrected parity; and G. transmitting the corrected data word and the corrected parity for the data word to a downstream device.

9. The method of claim 8 wherein comparing the data word to the correction mask to generate the corrected data word comprises performing an XOR operation on the data word and the correction mask.

10. The method of claim 8 wherein the form of the correction mask is generated by performing a reduction XOR operation on the correction mask.

11. The method of claim 8 wherein, in Step C, if no error is detected, the data word and the parity are transmitted to the downstream device.

12. The method of claim 8 wherein, if an error is detected in Step C, the method further includes determining whether the error is correctable.

13. The method of claim 12 wherein, if the error is determined to be not correctable, the data word and the parity are transmitted to the downstream device.

* * * * *